United States Patent
Saito

(10) Patent No.: US 6,573,739 B1
(45) Date of Patent: Jun. 3, 2003

(54) IC TESTING APPARATUS

(75) Inventor: Noboru Saito, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/283,571

(22) Filed: Apr. 1, 1999

(30) Foreign Application Priority Data

Apr. 1, 1998 (JP) .......................................... 10-105576

(51) Int. Cl.[7] .............................................. G01R 31/26

(52) U.S. Cl. .................. 324/755; 324/765; 324/754; 324/158.1

(58) Field of Search .............................. 324/158.1, 754, 324/755, 765; 209/537

(56) References Cited

U.S. PATENT DOCUMENTS

| | | | | |
|---|---|---|---|---|
| 5,177,435 A | * | 1/1993 | Kiyokawa et al. | 324/158.1 |
| 5,247,248 A | * | 9/1993 | Fukumaga | 324/158.1 |
| 5,788,084 A | * | 8/1998 | Onishi et al. | 209/573 |
| 6,066,822 A | * | 5/2000 | Nemoto et al. | 209/573 |
| 6,078,188 A | * | 6/2000 | Bannai et al. | 324/765 |
| 6,300,781 B1 | * | 10/2001 | Yap et al. | 324/755 |
| 6,208,155 B1 | * | 3/2002 | Barabi et al. | 324/755 |

* cited by examiner

Primary Examiner—Kamand Cuneo
Assistant Examiner—Jimmy Nguyen
(74) Attorney, Agent, or Firm—Birch, Stewart, Kolasch & Birch, LLP

(57) ABSTRACT

An IC testing apparatus performing a test by pushing input-output terminals HB of a DUT against contact pins 51 of a test head 104 in a state carried on a test tray TST, wherein a socket 50 or socket guide 40 is provided with a device guide 52 for contacting and positioning the DUT.

7 Claims, 11 Drawing Sheets

FIG. 6
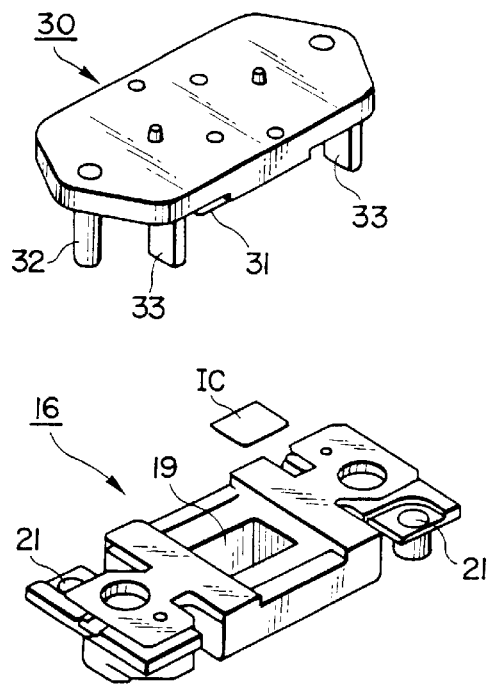
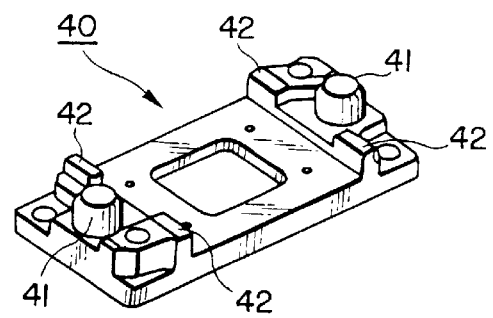
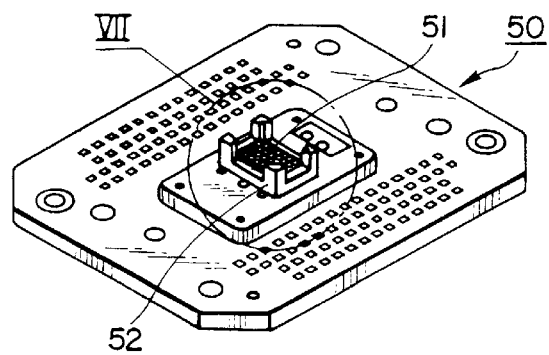

FIG. 8
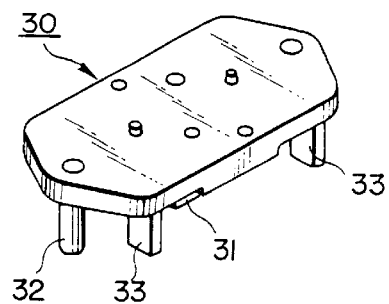
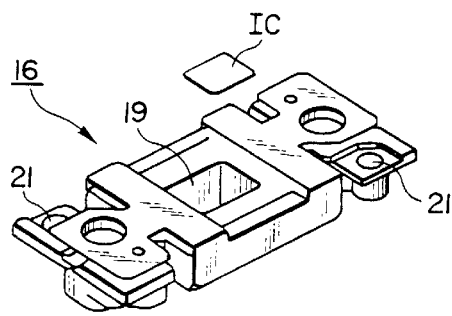
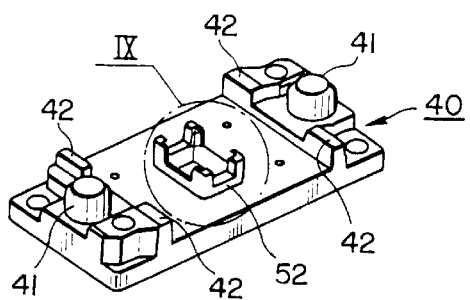
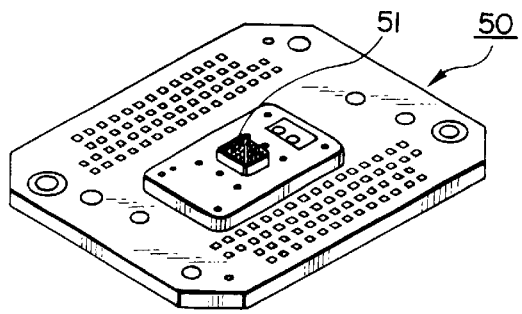

IC TESTING APPARATUS

BACKGROUND OF THE INVENTION

1. Field of the Invention

The present invention relates to an IC testing apparatus for testing one or more semiconductor integrated circuit devices (hereinafter referred to as an "IC" or "ICs"), more particularly relates to an IC testing apparatus superior in positioning accuracy of an IC or ICs to a contact section.

2. Description of the Related Art

An IC testing apparatus called a "handler" conveys a large number of ICs held on a tray to the inside of a testing apparatus where the ICs are made to electrically contact a test head, then the IC testing unit is made to perform the test. When the test is ended, the ICs are conveyed out from the test head and reloaded on trays in accordance with the results of the tests so as to sort them into categories of good ICs and defective ones.

In an IC testing apparatus of the related art, the trays for holding the DUTs (Devices under test) to be tested or the tested DUTs (hereinafter referred to the "customer trays") and the trays conveyed circulated inside the IC testing apparatus (hereinafter referred to as the "test trays") are different in type. In this type of IC testing apparatus, the ICs are switched between the customer trays and the test trays before and after the test. In the test process where the ICs are tested by being brought into contact with the test head, the ICs are pushed against the test head in the state held on the test trays.

In the case of a ball grid array (BGA) type IC, however, the contact section of the test head 104, as shown in FIG. 12, is comprised of a plurality of retractable contact pins 51 biased upward by springs (not shown). The front ends, as shown by the part B in FIG. 13, are formed with conical indentations 51a mating with the ball-shaped input-output terminals of the DUTs (hereinafter also referred to as the "solder balls HB").

In a conventional IC testing apparatus performing a test on ICs in a state held on a test tray, the DUTs are received at inserts attached to the test tray and the DUTs are pushed against the contact pins in a state with the inserts and socket guides positioned with respect to each other, therefore the total positional deviation between the DUTs and the contact pins becomes $\Delta a+\Delta b+\Delta c+\Delta d$ of the positional deviation $\Delta a$ between the ICs and inserts, the positional deviation $\Delta b$ between the inserts and the sockets, the positional deviation $\Delta c$ between the socket guides and the socket bodies, and the positional deviation $\Delta d$ between the socket bodies and the contact pins.

Therefore, as shown in part C of FIG. 13, the solder balls HB are pushed against the contact pins in an offset state and the solder balls HB are liable to be damaged by the sharp front ends of the contact pins 51.

In particular, with a chip size package (CSP) etc., since the dimensional accuracy of the package mold PM is extremely rough and the positional accuracy between the outer circumferential shape and the solder balls HB is not necessarily guaranteed, if an IC is positioned with respect to an insert by the outer circumferential surface of the package mold PM, the total positional deviation becomes remarkable.

If the dimensional accuracies of the inserts, socket guides, socket bodies, and contact pins are improved, it would be possible to reduce the total positional deviations $\Delta a$ to $\Delta d$, but there are certain limits as to how much these dimensional accuracies can be built in.

SUMMARY OF THE INVENTION

It is an object of the present invention to provide an IC testing apparatus superior in accuracy of positioning of a DUT with a contact section.

According to the present invention, there is provided a IC testing apparatus for testing one or more semiconductor devices: comprising a contact section which is provided at a test head and wherein input-output terminals of said semiconductor devices are pushed against, a tray which holds semiconductor devices on, and a guide which is provided at said contact section and said semiconductor devices are contacted and positioned thereby.

In the IC testing apparatus of the present invention, the DUT and contact section are not positioned indirectly through a plurality of members. A guide for positioning the DUT is provided directly at the contact section, therefore the positional deviation occurring between a DUT and the contact section becomes only the positional deviation between the DUT and the guide ($\Delta e$) and the positional deviation between the guide and the contact section itself ($\Delta f$). Here, for the positional deviation between the guide and the contact section itself, the dimensional accuracy is remarkably improved by adopting one-piece molding or other technique. Further, for the positional deviation between the DUT and the guide as well, since the guide itself is improved in dimensional accuracy by the molding technique, only the error in the manufacturing accuracy of the DUT itself becomes a problem.

In this way, since the error occurring between the DUT and the contact section is remarkably reduced, the positioning accuracy of the input-output terminals of the DUT with respect to the contact section is remarkably improved and as a result it is possible to prevent damage to the input-output terminals due to the contact section.

The set position of the guide of the present invention is not limited so long as it is at the contact section of the test head. All positions are included. For example, the guide is provided at either of the socket where the contact pins are provided or the socket guide which positions the socket. Of course, in the IC testing apparatus of the present invention, the positions of the socket board etc. are also included.

The DUT used in the present invention is not particularly limited. All types of ICs are included. As in the IC testing apparatus, however, the effect is particularly notable if the invention is applied to a so-called ball grid array type IC where the input-output terminals of the DUT are ball-shaped terminals.

The guide in the present invention is not particularly limited in its shape (does not matter if it positions continuously or positions partially), set position, number, materials, positioning location of DUT, etc. so long as it functions to contact and position a DUT. All are included.

The IC testing apparatus of the present invention is particularly preferably an IC testing apparatus of the type which pushes a DUT against a contact section of a test head in a state carried on a tray.

BRIEF DESCRIPTION OF THE DRAWINGS

These and other objects and features of the present invention will be explained in more detail below with reference to the attached drawings, wherein:

FIG. 6 is a disassembled perspective view of a pusher, insert (test tray), socket guide, and contact pins (socket) in the test head of FIG. 1;

FIG. 8 is a disassembled perspective view of another structure of a pusher, insert (test tray), socket guide, and contact pins (socket) in the test head of FIG. 1;

DESCRIPTION OF THE PREFERRED EMBODIMENTS

Embodiments of the present invention will be explained below based on the drawings.

Figure 1:
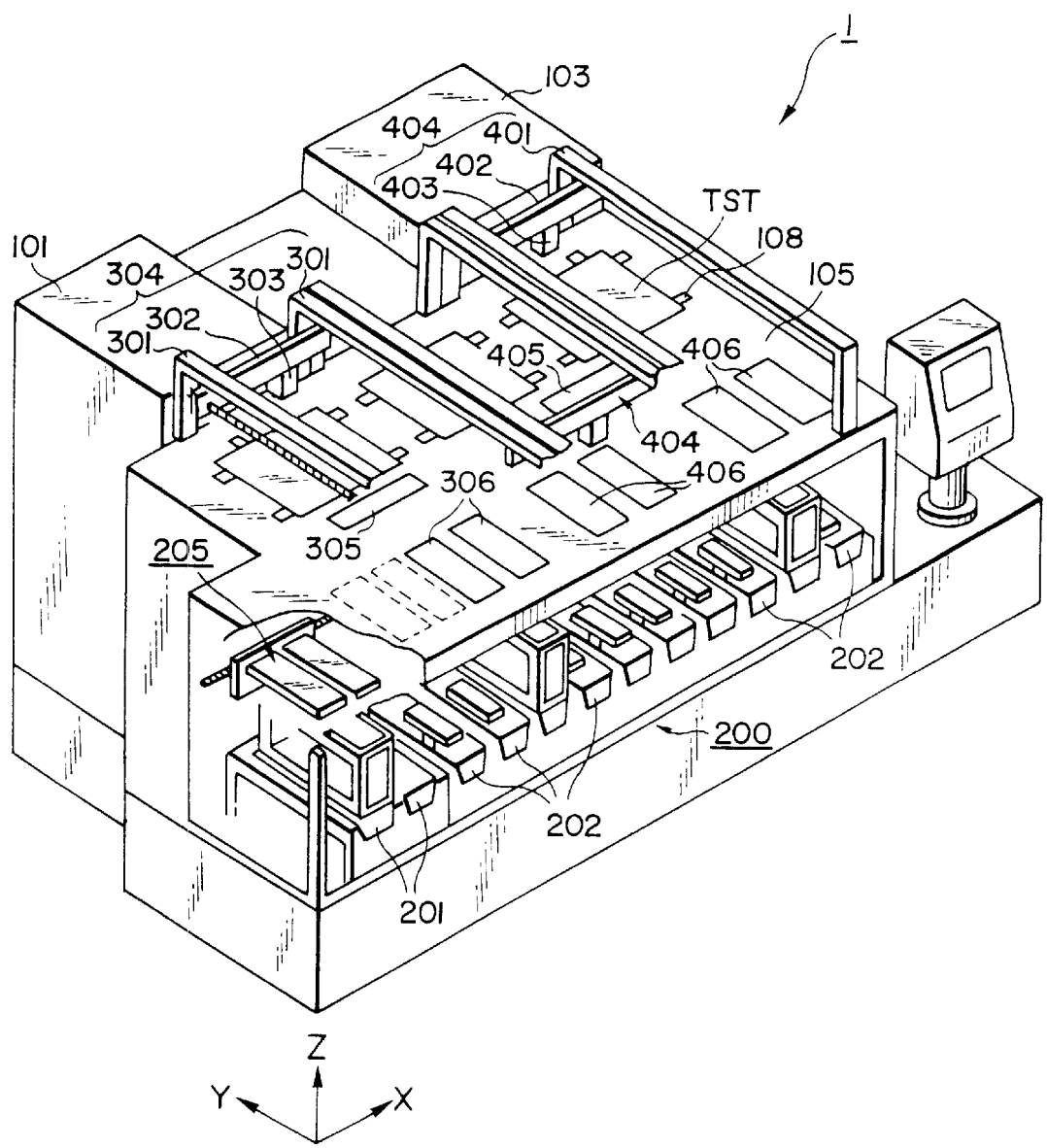
FIG. 1 is a perspective view of a first embodiment of an IC testing apparatus according to the present invention.
Figure 2:
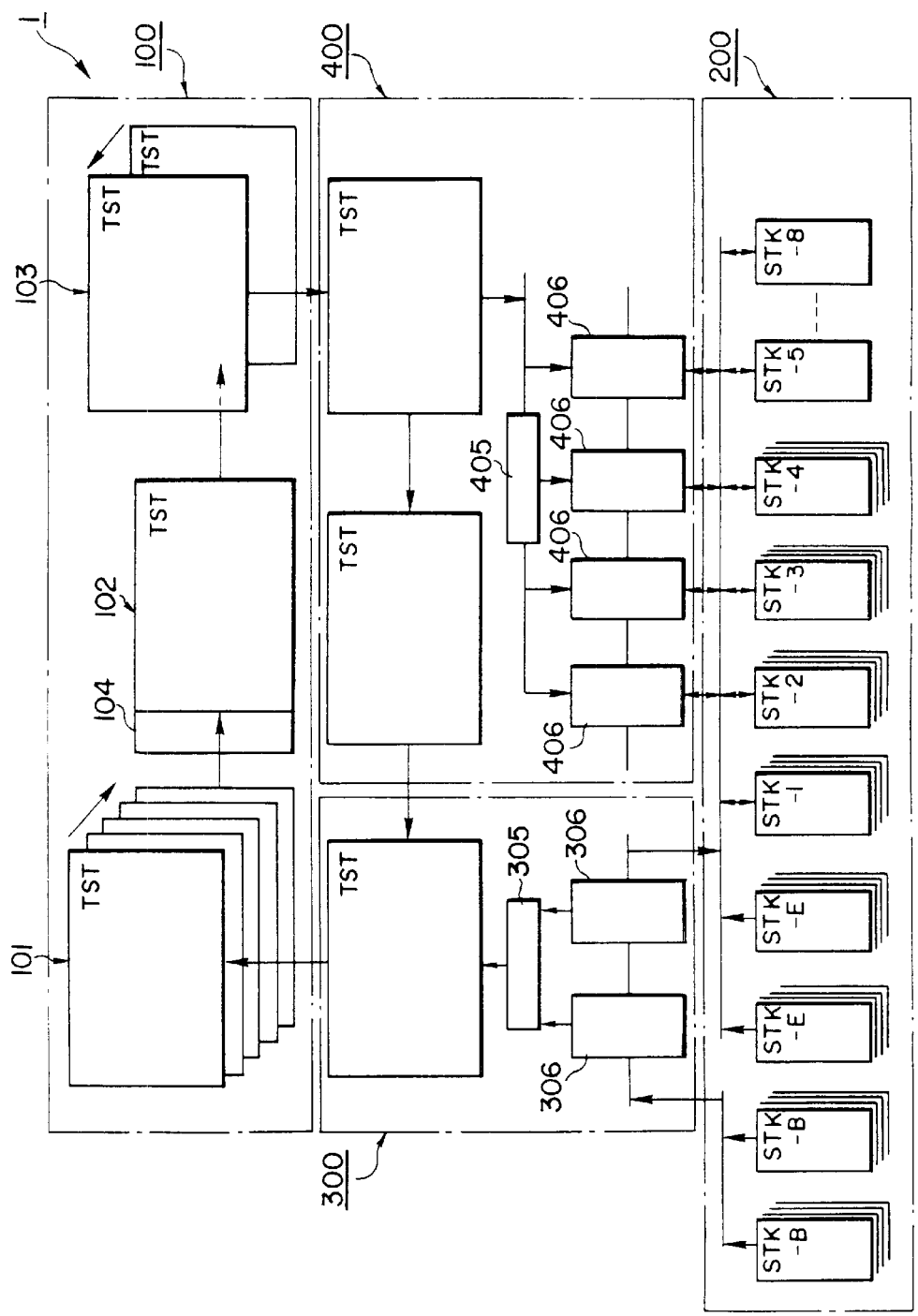
FIG. 2 is a flow chart of movement of a tray showing a method of handling a DUT in the IC testing apparatus of FIG. 1.

Note that FIG. 2 is a view for explaining the method of handling of a DUT in the IC testing apparatus of the present embodiment and shows by a plan view members actually arranged aligned in the vertical direction. Therefore, the mechanical (three-dimensional) structure is explained with reference to FIG. 1.

Figure 4:
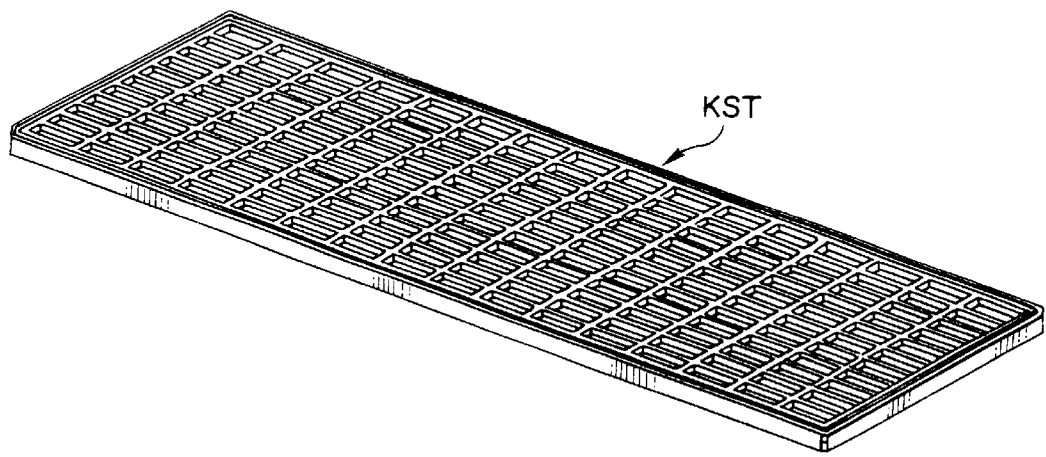
FIG. 4 is a perspective view of a customer tray used in the IC testing apparatus of FIG. 1.

The IC testing apparatus 1 of the present embodiment tests (inspects) whether the IC is operating suitably in a state applying a high temperature or low temperature thermal stress to the DUT or not applying, and classifies the DUTs in accordance with the test results. The operating test in the state with thermal stress applied is performed by reloading the DUTs from the tray carrying a large number of DUTs to be tested (hereinafter also called the "customer tray KST", see FIG. 4) to a test tray TST (see FIG. 5) conveyed through the inside of the IC testing apparatus 1.

Therefore, the IC testing apparatus 1 of the present embodiment, as shown in FIG. 1 and FIG. 2, is comprised of an IC magazine 200 which holds the DUTs to be tested or classifies and stores the tested DUTs, a loader section 300 which sends the DUTs from the IC magazine 200 into a chamber section 100, a chamber section 100 including a test head, and an unloader section 400 classifying and taking out tested DUTs which had been tested in the chamber section 100.

IC Magazine 200

The IC magazine 200 is provided with a pre-test IC stocker 201 for holding DUTs to be tested and a tested IC stocker 202 for holding DUTs classified in accordance with the test results.

Figure 3:
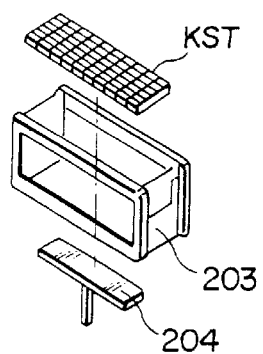
FIG. 3 is a perspective view of the structure of an IC stocker of the IC testing apparatus of FIG. 1.

These pre-test IC stocker 201 and post-test IC stocker 202, as shown in FIG. 3, are each comprised of a frame-shaped tray support frame 203 and an elevator 204 able to enter from under the tray support frame 203 and move toward the top. The tray support frame 203 supports in it a plurality of stacked customer trays KST. Only the stacked customer trays KST are moved up and down by the elevator 204.

The pre-test IC stocker 201 holds stacked customer trays KST on which the DUTs to be tested are held, while the post-test IC stocker 202 holds stacked customer trays KST on which DUTs finished being tested are suitably classified.

Note that since the pre-test IC stocker 201 and the post-test IC stocker 202 are structured the same, the numbers of the pre-test IC stocker 201 and the post-test IC stocker 202 may be suitably set in accordance with need.

In the example shown in FIG. 1 and FIG. 2, the pre-test stocker 201 is provided with two stockers STK-B and provided next to that with two empty stockers STK-E to be sent to the unloader section 400, while the post-test IC stocker 202 is provided with eight stockers STK-1, STK-2, . . . , STK-8 and can hold ICs sorted into a maximum of eight classes according to the test results. That is, in addition to classifying ICs as good and defective, it is possible to divide the good ICs into ones with high operating speeds, ones with medium speeds, and ones with low speeds and the defective ICs into ones requiring retesting etc.

Loader Section 300

The above-mentioned customer tray KST is conveyed from the lower side of the test board 105 to an opening 306 of the loader section 300 by a tray transfer arm 205 provided between the IC magazine 200 and test board 105. Further, in the loader section 300, the DUTs loaded on the customer tray KST are transferred once to a preciser 305 by the X-Y conveyor 304. There, the mutual positions of the DUTs are corrected, then the DUTs transferred to the preciser 305 are reloaded on the test tray TST stopped at the loader section 300 using the X-Y conveyor 304 again.

The X-Y conveyor 304 reloading the DUTs from the customer tray KST to the test tray TST, as shown in FIG. 1, is provided with two rails 301 laid over the top of the test board 105, a movable arm 302 able to move back and forth (this direction designated as the Y-direction) between the test tray TST and a customer tray KST by these two rails 301, and a movable head 303 supported by the movable arm 302 and able to move in the X-direction along the movable arm 302.

The movable head 303 of the X-Y conveyor 304 has suction heads attached facing downward. The suction heads move while drawing out air to pick up the DUTs from the customer tray KST and reload the DUTs on the test tray TST. For example, about eight suction heads are provided for the movable head 303, so it is possible to reload eight DUTs at one time on the test tray TST.

Note that in a general customer tray KST, indentations for holding the DUTs are formed relatively larger than the shapes of the DUTs, so the positions of the DUTs in a state held on the customer tray KST can vary largely. Therefore, if the DUTs are picked up by the suction heads and conveyed directly to the test tray TST in this state, it becomes difficult for the ICs to be dropped accurately into the IC receiving indentations formed in the test tray TST. Therefore, in the IC testing apparatus 1 of the present embodiment, an IC position correcting means called a preciser 305 is provided between the set position of the customer tray KST and the test tray TST. This preciser 305 has relatively deep indentations surrounded with inclined surfaces at their circumferential edges, so when DUTs picked up by the suction heads are dropped into these indentations, the drop positions of the DUTs are corrected by the inclined surfaces. Due to this, the positions of the eight DUTs with respect to each other are accurately set and it is possible to pick up the correctly positioned DUTs by the suction heads once again and reload them on the test tray TST and thereby reload the DUTs precisely in the IC receiving indentations formed in the test tray TST.

Chamber Section 100

The above-mentioned test tray TST is conveyed into the chamber section 100 after being loaded with the DUTs by the loader section 300, then the DUTs are tested in a state carried on the test tray TST.

The chamber section 100 is comprised of a constant temperature chamber 101 for giving a desired high temperature or low temperature thermal stress, or no thermal stress to the DUTs loaded on the test tray TST, a test chamber 102 for making the DUTs contact the test head in a state given the thermal stress or no thermal stress by the constant temperature chamber 101, and a soak chamber 103 for removing the given thermal stress from the DUTs tested in the test chamber 102.

In the soak chamber 103, when a high temperature was applied in the constant temperature chamber 101, the DUTs are cooled by blowing in air to return them to room temperature. Alternatively, when a low temperature of about −30° C. has been applied in the constant temperature chamber 101, it heats the DUTs by hot air or a heater etc. to return them to a temperature where no condensation occurs. Next, the thus treated DUTs are conveyed out to the unloader section 400.

As shown in FIG. 1, the constant temperature chamber 101 and soak chamber 103 of the chamber section 100 are arranged so as to project upward from the test chamber 102. Further, the constant temperature chamber 101 is provided with a vertical conveyor as shown schematically in FIG. 2. A plurality of test trays TST stand by supported by the vertical conveyor until the test chamber 102 becomes empty. While standing by, a high temperature or low temperature thermal stress is applied to the DUTs.

The test chamber 102 has a test head 104 arranged at its center. A test tray TST is conveyed above the test head 104 and the DUTs are tested by bringing their input-output terminals HB into electrical contact with the contact pins 51 of the test head 104. On the other hand, the test tray TST finished being tested is treated in the soak chamber 103 to return the temperature of the ICs to room temperature, then is discharged to the unloader section 400.

In front of the constant temperature chamber 101 and the top of the soak chamber 103 is provided a test board 105 as shown in FIG. 1. This test board has a test tray conveyor 108 mounted on it. The test tray TST discharged from the soak chamber 103 by the test tray conveyor 108 provided on the test board 105 is returned to the constant temperature chamber 101 through the unloader section 400 and the loader section 300.

Figure 5:
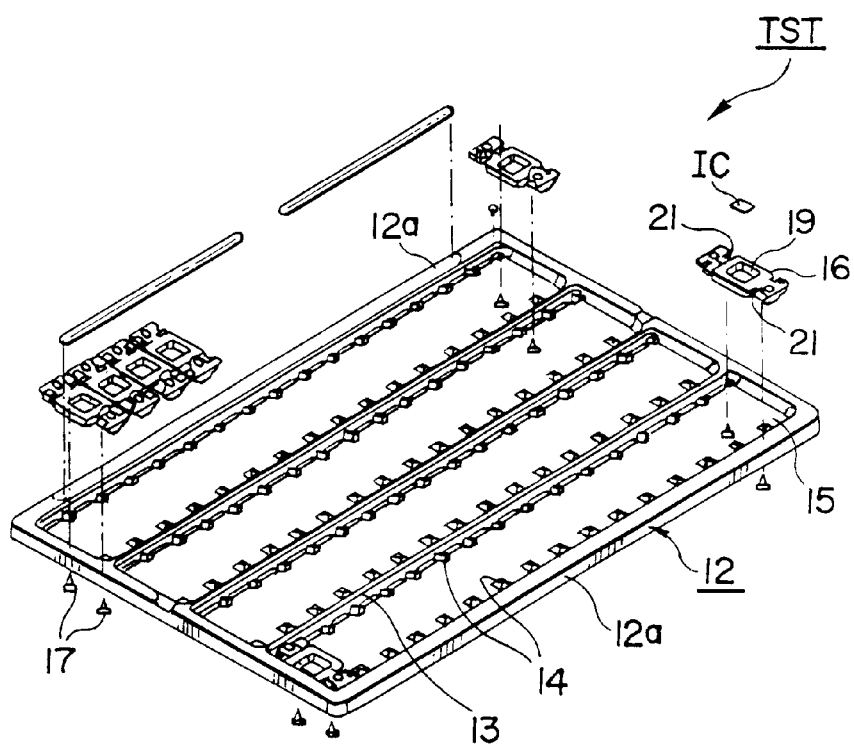
FIG. 5 is a partially disassembled perspective view of a test tray used in the IC testing apparatus of FIG. 1.

FIG. 5 is a disassembled perspective view of the structure of a test tray TST used in the present embodiment. The test tray TST is comprised of a rectangular frame 12 provided with a plurality of crosspieces 13 in parallel at equal intervals and has a plurality of mounting pieces 14 formed projecting out at equal intervals at the two sides of these crosspieces 13 and the sides 12a of the frame 12 facing the crosspieces 13. Insert holders 15 are comprised between these crosspieces 13, between the crosspieces 13 and the sides 12a, and the two mounting pieces 14.

The insert holders 15 are designed to receive one insert 16 each. An insert 16 is attached to the two mounting pieces 14 in a floating state using fasteners 17. Therefore, mounting holes 21 to the mounting pieces 14 are formed at the two ends of the inserts 16. For example, about 16×4 of these inserts 16 are provided in one test tray TST.

Note that the inserts 16 are made the same shape and same dimensions and that the DUTs are received in the inserts. The IC holder 19 of the insert 16 is determined by the shape of the DUT to be received and in the example shown in FIG. 5 is made a rectangular indentation.

Here, if the DUTs once connected to the test head 104 are arranged in four rows and 16 columns as shown in FIG. 5, then for example four rows of four columns of DUTs are simultaneously tested. That is, in the first test, the 16 DUTs arranged every fourth column from the first column are tested connected to the contact pins 51 of the test head 104. In the second test, the test tray TST is moved one column and the DUTs arranged every fourth column from the second column are similarly tested. By doing this a total of four times, all of the DUTs are tested. The results of the test are stored at addresses determined by for example the identification number assigned to the test tray TST and the numbers of the DUTs assigned inside the test tray TST.

Figure 7:
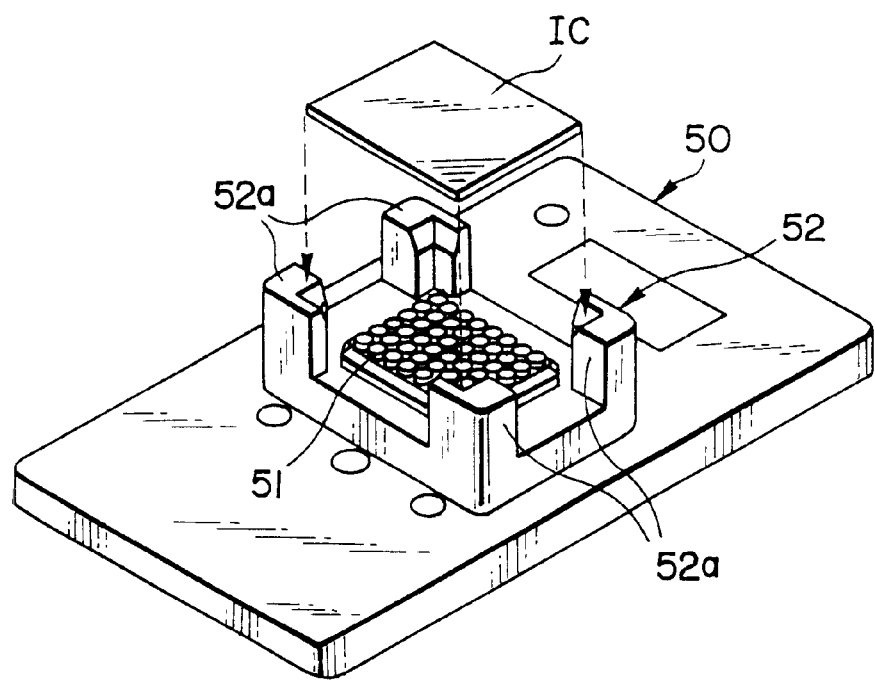
FIG. 7 is a perspective view showing the part VII of FIG. 6 enlarged.
Figure 10:
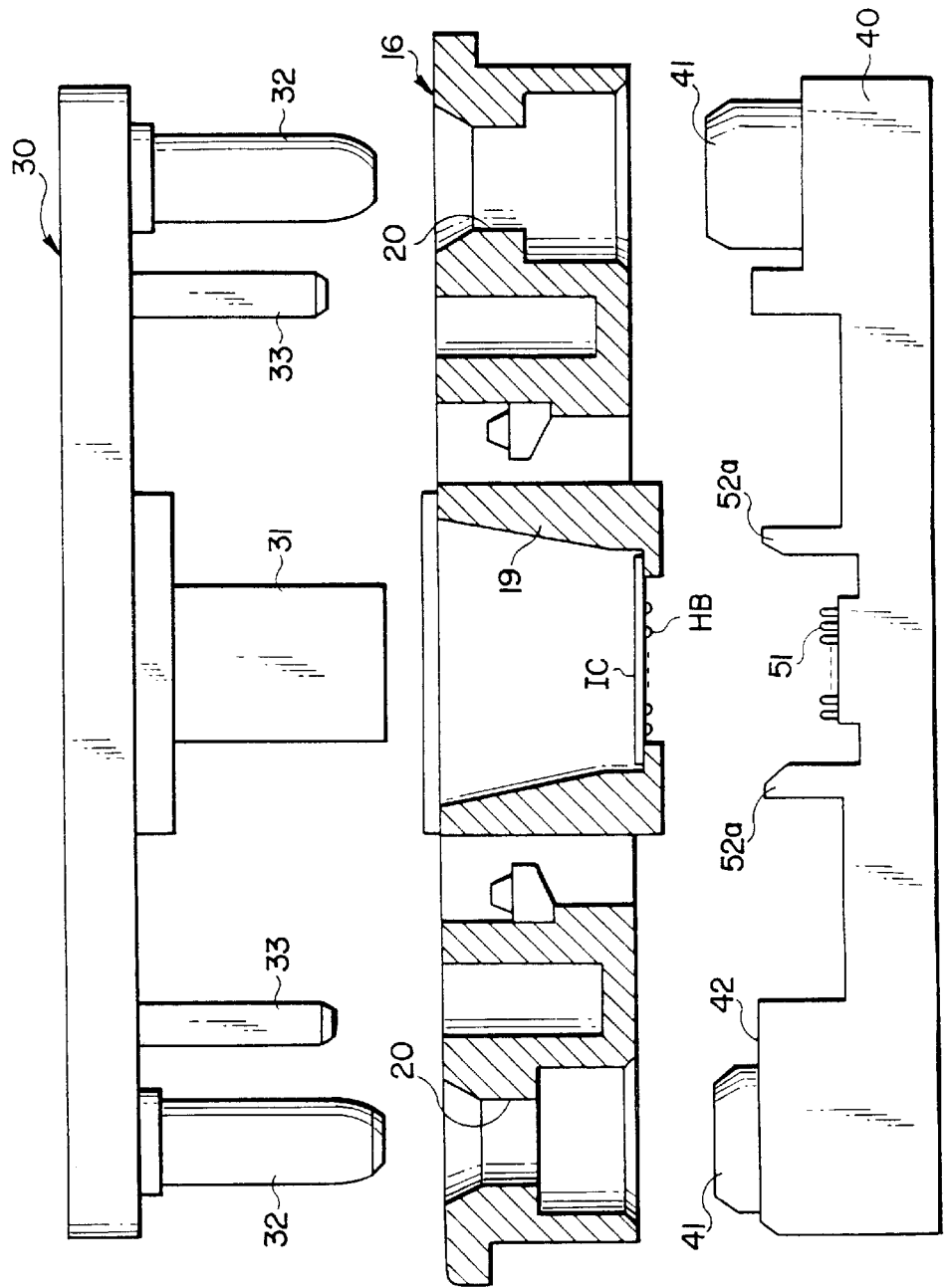
FIG. 10 is a sectional view of FIG. 6 and FIG. 8.
Figure 11:
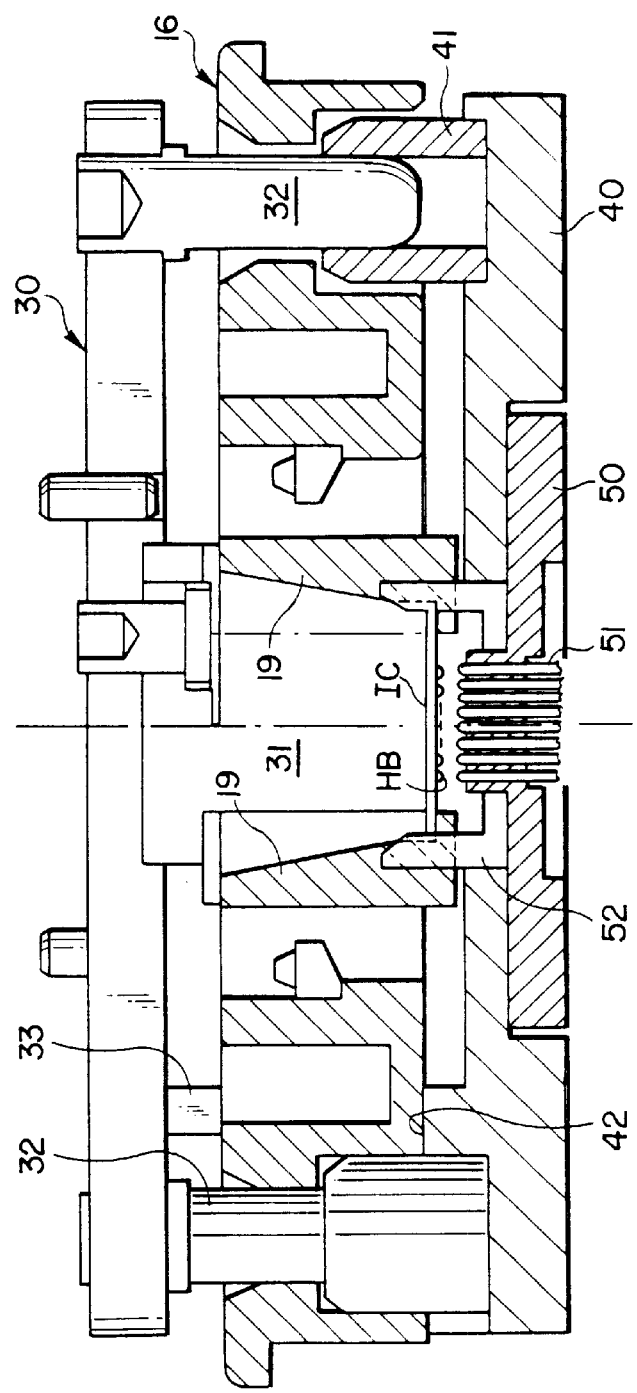
FIG. 11 is a sectional view of the state where the pusher descends in the test head of FIG. 10.
Figure 12:
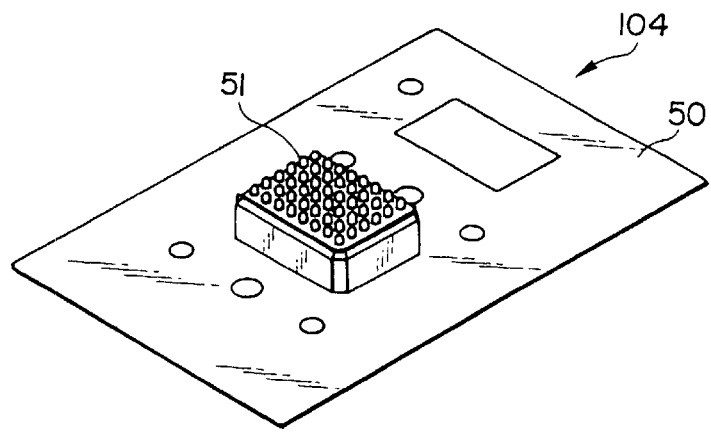
FIG. 12 is a perspective view of general contact pins (socket)
Figure 13:
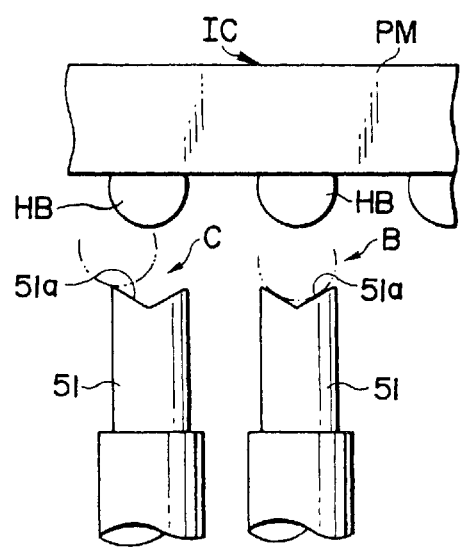
FIG. 13 is a sectional view of important parts showing the state of contact of the ball terminals and contact pins of an IC.

FIG. 6 is a disassembled perspective view of a pusher 30, insert 16 (test tray TST side), socket guide 40, and contact pins 51 in the test head 104 of the IC testing apparatus, FIG. 7 is a perspective view showing the part VII of FIG. 6 enlarged, FIG. 10 is a sectional view of FIG. 6, and FIG. 11 is a sectional view of the state where a pusher 30 descends in the test head 104.

The pusher 30 is provided at the top side of the test head 104 and is moved vertically in the Z-direction by a Z-axial drive, not shown (for example, a fluid pressure cylinder). Pushers 30 are attached to the Z-axial drive corresponding to the intervals of the DUTs to be tested at one time (in the above test tray, total sixteen of four rows every four columns).

A pusher 30 has formed at its center a rod 31 for pushing the DUT. It is provided at its two sides with guide pins 32 to be inserted into guide holes 20 of the insert 16 mentioned later and the guide bushes 41 of the socket guide 40. Further, between the rod 31 and the guide pins 32 are provided stopper guide 33 for limiting the descent of the pusher 30 by the Z-axial drive as a lower limit. This stopper guide 33 abuts against the stopper surface 42 of the socket guide 40 to determine the lower limit position of the pusher 30 for pushing by a suitable pressure not breaking the DUT.

The insert 16, as explained also in FIG. 5, is attached to the test tray TST using a fastener 17. It is formed at its two sides with guide holes 20 through which the above-mentioned guide pins 32 of the pusher 30 and the guide bushes 41 of the socket guide 40 are inserted. As shown by the state of descent of the bush of FIG. 11, the guide hole 20 at the left side in the FIGure is made a small diameter at its upper half where the guide pin 32 of the pusher 30 is inserted for positioning and is made a large diameter at its lower hole where the guide bush 41 of the socket guide 40 is inserted for positioning. Note that the guide hole 20 at the right side in the FIGure fits with play with the guide pin 32 of the pusher 30 and the guide bush 41 of the socket guide 40.

The insert 16 is formed at its center with an IC holder 19. By dropping a DUT here, the DUT is loaded on the test tray TST.

On the other hand, the socket guide 40 fixed to the test head 104 is provided at its two sides with guide bushes 41 for insertion of the two guide pins 32 of the pusher 30 and positioning with these two guide pins 32. The guide bush 41 at the left side also performs positioning with the insert 16.

At the lower side of the socket guide 40 is fixed a socket 50 having a plurality of contact pins 51. These contact pins 51 are biased in the upward direction by not shown springs. Therefore, even if pushing a DUT, the contact pins 51 will retract to the top surface of the socket 50. On the other hand, it is possible for the contact pins 51 to contact all of the terminals HB even if the DUTs are pushed somewhat at an angle. Note that at the front ends of the contact pins 51 are formed substantially conical indentations 51a for receiving the solder balls HB of a ball grid array type IC.

In particular, in the present embodiment, as shown in FIG. 6 and FIG. 7, a device guide 52 is provided at the socket 50 for guiding the outer circumferential surface of the package mold PM of a DUT so as to position it. This device guide 52, as shown in FIG. 7, has walls 52a having tapered surfaces drawing in the four corners of the DUT. The areas between the walls are cut away. Due to this, it is possible to have the DUT received in the device guide 52 in a state where the IC holder 19 of the insert 16 holds the DUT.

The device guide 52 may be formed as one piece with the socket 50. If it is possible to ensure the dimensional accuracy with the socket 50, then it may also be formed separately and then joined with it. Further, the specific shape of the device guide 52 shown in the FIGure is not particularly limited. Other various forms may be considered for the guide of the present invention.

Figure 9:
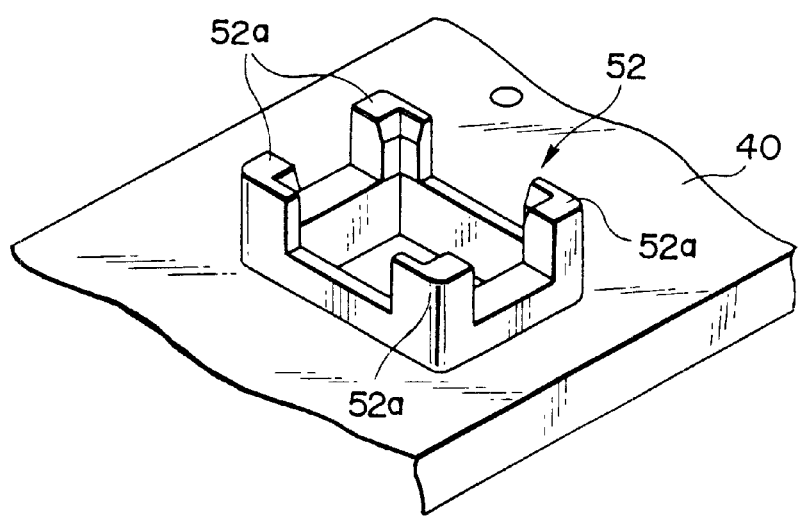
FIG. 9 is a perspective view showing the part IX of FIG. 8 enlarged.

Another embodiment shown in FIG. 8 and FIG. 9 is an example where the device guide 52 is provided not at the socket 50, but at the socket guide 40 side. The device guide 52 guides the outer circumferential surface of the package mold PM of the BGA type or other DUT for positioning. In this case as well, the device guide 52 may be formed in one piece with the socket guide 40. If the dimensional accuracy with the socket guide 40 can be secured, it may also be formed separately and the two later joined. Further, the specific shape of the device guide 52 shown in the FIGure is not particularly limited.

Unloader Section 400

The unloader section 400 is provided with two X-Y conveyors 404, 404 of the same structure as the X-Y conveyor 304 provided at the loader section 300. The X-Y conveyors 404, 404 reload the post-test ICs from the test tray TST carried out to the unloader section 400 to the customer tray KST.

As shown in FIG. 1, the test board 105 of the unloader section 400 is provided with two pairs of openings 406, 406 arranged so that the customer trays KST carried to the unloader section 400 can be brought close to the top surface of the test board 105.

Further, while not illustrated, an elevator table for elevating or lowering a customer tray KST is provided below the openings 406. A customer tray KST becoming full after being reloaded with the tested DUTs is placed on here and lowered and the full tray is passed to the tray transfer arm 205.

Note that in the IC testing apparatus 1 of the present embodiment, while there are a maximum of eight types of sortable categories, it is only possible to arrange a maximum of four customer trays KST at the openings 406 of the unloader section 400. Therefore, there is a limit of four sortable categories in real time. In general, four categories are sufficient, i.e., good ICs can be classified into high speed response devices, medium speed response devices, and low speed response devices plus defective devices, but there may also arise categories not belonging to these categories such as devices requiring retesting.

In this way, when DUTs arise which are classified into a different category than the categories given to four customer trays arranged at the openings 406 of the unloader section 400, one customer tray KST may be returned from the unloader section 400 to the IC magazine 200 and a customer tray KST to hold DUTs of the newly arising category may be transferred to the unloader section 400 in its place so as to hold these DUTs. If customer trays KST are switched in the middle of sorting work, the sorting work has to be interrupted during that time and therefore there is the problem of a reduction in the throughput. Therefore, in the IC testing apparatus 1 of the present embodiment, a buffer section 405 is provided between the test tray TST and the opening 406 of the unloader section 400, and DUTs of a category rarely appearing are stored temporarily at this buffer section 405.

For example, the buffer section 405 is given a capacity able to hold 20 to 30 or so DUTs. A memory is provided for storing the category of ICs held at the IC holding locations of the buffer section 405. The categories and positions of the DUTs temporarily stored at the buffer section 405 are stored for each DUT. In the intervals of the sorting work or when the buffer section 405 has become full, customer trays KST of the categories to which the DUTs stored at the buffer section 405 belong are called up from the IC magazine 200 and the ICs received on these customer trays KST. At this time, sometimes the DUTs temporarily stored at the buffer section 405 span several categories, but at this time it is sufficient to call up several customer trays KST at one time from the openings 406 of the unloader section 400 when calling up customer trays KST.

The mode of operation will be explained next.

In the test process inside the chamber section 100, the DUTs are conveyed above the test head 104 in the state carried on the test tray TST shown in FIG. 5, more specifically the individual DUTs are conveyed in the state dropped into the IC holders 19 of the inserts 16 of the FIGure.

When the test tray TST stops at the test head 104, the Z-axial drive starts to operate and each pusher 30 shown in FIG. 10 to FIG. 11 descends with respect to each insert. The two guide pins 32, 32 of the pusher 30 pass through the guide holes 20, 20 of the inserts 16 and engage with the guide bushes 41, 41 of the socket guides 40.

This state is shown in FIG. 11. The inserts 16 and the pushers 30 have a certain degree of positional error with respect to the sockets 50 and socket guides 40 fixed to the test head 104 (that is, the IC testing apparatus 1 side). The guide pins 32 of the left sides of the pushers 30 are fit into the small diameter holes of the guide holes 20 of the inserts 16 for positioning the pushers 30 and the inserts 16, so as a result it is possible for the rods 31 of the pushers 30 to push the DUTs at suitable positions.

Further, the large diameter hole of the guide holes 20 at the left sides of the inserts 16 engage with the guide bushes 41 of the left sides of the socket guides 40, whereby the inserts 16 and the socket guides 40 are positioned with respect to each other and whereby the positioning accuracy of the DUTs and the contact pins 51 is improved.

In particular, in the present embodiment and other modifications, as shown in FIG. 11, the DUTs held at the IC holders 19 of the inserts 16 are positioned (corrected in altitude) by being drawn in by the walls 52a of the device guides 52 provided at the sockets 50 or socket guides 40 when pushed by the pushers 30, so it is possible to realize positioning between the input-output terminals, that is, solder balls HB, and the contact pins 51 with a high accuracy.

Note that since the positioning accuracy between the solder balls HB and the contact pins 51 is sufficiently drawn out in the state shown in FIG. 11, the pushers 30 are made to further descend until the stopper guides 33 abut against the stopper surface 42 and the DUTs are made to contact the contact pins 51 by the rods 31 without any other positioning.

Note that the embodiments explained above were described to facilitate the understanding of the present invention and not to limit the present invention. Accordingly, elements disclosed in the above embodiments include all design modifications and equivalents belonging to the technical field of the present invention.

Summarizing the effect of the invention, as explained above, according to the present invention, since a DUT and contact section are not indirectly positioned through several members, but a guide for positioning a DUT is provided directly at the contact section, the positional deviation occurring between the DUT and the contact section becomes only the positional deviation (Δe) between the DUT and the guide and the positional deviation (Δf) between the guide and the contact section itself. Here, for the positional deviation between the guide and the contact section itself, the dimensional accuracy is remarkably improved by adopting one-piece molding or another technique. Further, for the positional deviation between the DUT and the guide as well, the guide itself is improved in dimensional accuracy by the molding technique.

In this way, since the error occurring between the DUT and the contact section is remarkably reduced, the accuracy of positioning of the input-output terminals of the DUT with respect to the contact section is remarkably improved and as a result it is possible to prevent damage to the input-output terminals due to the contact section.

What is claimed is:

1. An IC testing apparatus for testing one or more semiconductor devices, comprising:

a contact section which is provided at a test head and wherein input-output terminals of said semiconductor devices are pushed against, a tray which holds said semiconductor devices thereon, a pusher which pushes said semiconductor devices while held on said tray in the direction of an opposite side of said contact section, and a guide which is provided at said contact section by which said semiconductor devices are contacted to adjust the position of said semiconductor devices thereby, wherein said semiconductor devices are pushed against said contact section while held on said tray, and wherein the position of said semiconductor devices are adjusted by said tray until said pusher starts to push said semiconductor devices and then the position of said semiconductor devices are adjusted by said guide after said pusher starts to push its semiconductor devices.

2. An IC testing apparatus according to claim 1, wherein said guide is provided at a socket where contact pins of the test head are provided.

3. An IC testing apparatus according to claim 1, wherein said guide is provided at a socket guide for positioning a socket where contact pins of the test head are provided.

4. An IC testing apparatus according to claim 1, wherein said guide has walls having tapered surfaces drawing in four corners of said semiconductor device.

5. An IC testing apparatus according to claim 1, wherein the input-output terminals of said semiconductor devices are ball-shaped terminals.

6. An IC testing apparatus according to claim 5, wherein said semiconductor device is a ball grid array type IC.

7. An IC testing apparatus according to claim 6, wherein said semiconductor device has a chip size package.

* * * * *